United States Patent
Okada

(10) Patent No.: US 8,149,067 B2
(45) Date of Patent: Apr. 3, 2012

(54) VOLTAGE-CONTROLLED OSCILLATOR

(75) Inventor: Kenichi Okada, Ota-ku (JP)

(73) Assignee: Semiconductor Technology Academic Research Center, Yokohama-shi, Kanagawa (JP)

( * ) Notice: Subject to any disclaimer, the term of this patent is extended or adjusted under 35 U.S.C. 154(b) by 24 days.

(21) Appl. No.: 12/782,519

(22) Filed: May 18, 2010

(65) Prior Publication Data

US 2010/0295627 A1 Nov. 25, 2010

(30) Foreign Application Priority Data

May 19, 2009 (JP) .................................. 2009-121248

(51) Int. Cl.
*H03B 5/12* (2006.01)
(52) U.S. Cl. .................................. 331/117 FE; 331/175
(58) Field of Classification Search .............. 331/117 R, 331/117 FE, 167, 175, 185, 109, 182, 183
See application file for complete search history.

(56) References Cited

U.S. PATENT DOCUMENTS

| | | | |
|---|---|---|---|
| 7,034,623 B2 * | 4/2006 | Khalil .............................. | 331/34 |
| 2002/0145481 A1 * | 10/2002 | Murgulescu .............. | 331/117 R |

OTHER PUBLICATIONS

Kwok et al. "Ultra-Low-Voltage High-Performance CMOS VCOs Using Transformer Feedback." *IEE J. of Solid-State Circuits.* vol. 40. No. 3. 2005. pp. 652-660.
Mazzanti et al. "Class-C Harmonic CMOS VCOs, With a General Result on Phase Noise." *IEEE J. of Solid-State Circuits.* vol. 43. No. 12. 2008. pp. 2716-2729.
Mazzanti et al. "A 1.4 mW 4.90-to-5.65 GHz Class-C CMOS VCO with an Average FoM of 194.5 dBc/Hz," *ISSCC*, No. 26-2, 2008. pp. 474-476.

* cited by examiner

*Primary Examiner* — Ryan Johnson
(74) *Attorney, Agent, or Firm* — Merchant & Gould P.C.

(57) ABSTRACT

A voltage-controlled oscillator that can achieve low phase noise while ensuring stable oscillation startup and stable oscillation maintenance even under low supply voltage conditions. The voltage-controlled oscillator includes an LC parallel resonant circuit, whose impedance varies with a control input voltage and a negative resistance circuit for introducing negative resistance into the LC parallel resonant circuit, wherein the negative resistance circuit includes at least: a first amplifier circuit, provided in parallel with the LC parallel resonant circuit and having a first pair of transistors cross-coupled via a capacitor, that achieves class-C amplifier operation by biasing the gate of each transistor in the first transistor pair with a first bias voltage; and a similarly configured second amplifier circuit that achieves class-C amplifier operation by biasing the gate of each transistor with a second bias voltage which is different from the first bias voltage.

7 Claims, 5 Drawing Sheets

VOLTAGE-CONTROLLED OSCILLATOR

This application claims benefit of Ser. No. 2009-121248, filed 19 May 2009 in Japan and which application is incorporated herein by reference. To the extent appropriate, a claim of priority is made to the above disclosed application.

BACKGROUND OF THE INVENTION

1. Field of the Invention

The present invention relates to a voltage-controlled oscillator (VCO), which oscillates at a frequency proportional to a control input voltage, and more particularly to an LC-tank voltage-controlled oscillator (LC-VCO).

2. Description of the Related Art

The phase noise of an LC-tank voltage-controlled oscillator is determined by the S/N ratio (Signal-to-Noise Ratio) in the LC tank. The root mean square values of signal voltage $V_{sig}$ and noise voltage $V_n$ are respectively expressed as $$V_{sig}^2 = R_t^2 I_{sig}^2$$

$$V_n^2 = 4kTR_t$$

where k is the Boltzmann constant, T is the absolute temperature, $R_t$ is the parallel impedance of the LC tank, and $I_{sig}$ is the signal current amplitude.

Hence, the root mean square value of the S/N ratio is given as $$(S/N)^2 = R_t^2 I_{sig}^2 / 4kT$$

From the above equation, it can be seen that phase noise improves with increasing signal amplitude. However, since the signal amplitude is limited by supply voltage, the phase noise degrades when VCO is operated at a low supply voltage.

In the prior art, a transformer-feedback (TF) VCO is proposed as a VCO that operates at a low supply voltage (refer to non-patent document 1 listed below). In this transformer-feedback VCO, each source node voltage in a cross-coupled transistor pair is lowered below 0 [V] by a transformer, and the voltage amplitude in the LC tank is increased. However, since the operation involves current flow in a region where the impulse sensitivity function (ISF) is large, it is difficult to achieve a low-phase-noise design with this technique.

On the other hand, an LC-VCO known as a Class-C VCO is proposed (refer to non-patent documents 2 and 3 listed below). This VCO is constructed so that, in an LC-VCO having a cross-coupled transistor pair, the transistor gate portion is DC-cut by a capacitor to lower the gate bias below the threshold, thereby causing the transistor to operate as if it were a class-C amplifier.

In a VCO, the ISF from thermal noise to phase noise differs depending on the phase of oscillation. More specifically, the ISF is smaller for a phase where the amplitude of the oscillation voltage is larger. The class-C VCO is intended to achieve low phase noise by flowing a current only in a phase range where the ISF is small. However, in the class-C VCO, the gate bias must be reduced below the threshold voltage. As a result, under low supply voltage conditions, the amplitude cannot be made large enough, and oscillations may not occur. On the other hand, under low amplitude conditions, the conduction angle cannot be reduced to take advantage of the characteristics of the class-C VCO, and the intended low phase noise cannot be achieved.

Non-patent document 1: K. Kwok, and H. C. Luong, "Ultra-Low-Voltage High-Performance CMOS VCOs Using Transformer Feedback," IEEE JSSC, vol. 40, no. 3, pp. 652-660, March 2005.

Non-patent document 2: A. Mazzanti, and P. Andreani, "Class-C Harmonic CMOS VCOs, With a General Result on Phase Noise," IEEE JSSC, vol. 44, no. 12, pp. 2716-2729, December 2008.

Non-patent document 3: A. Mazzanti, and P. Andreani, "A 1.4 mW 4.90-to-5.65 GHz Class-C CMOS VCO with an Average FoM of 194.5 dBc/Hz," ISSCC, No. 26-2, February 2008.

SUMMARY OF THE INVENTION

The present invention has been devised in view of the above problem, and it is an object of the invention to provide a voltage-controlled oscillator that can achieve low phase noise while ensuring stable oscillation startup and stable oscillation maintenance even under low supply voltage conditions.

To achieve the above object, according to the present invention, a voltage-controlled oscillator is provided, which includes an LC parallel resonant circuit whose impedance varies with a control input voltage and a negative resistance circuit for introducing negative resistance into the LC parallel resonant circuit, the negative resistance circuit comprising at least: a first amplifier circuit, provided in parallel with the LC parallel resonant circuit and having a first pair of transistors cross-coupled via a capacitor, that achieves class-C amplifier operation by biasing a gate or base of each transistor in the first transistor pair with a first bias voltage; and a second amplifier circuit, provided in parallel with the LC parallel resonant circuit and having a second pair of transistors cross-coupled via a capacitor, that achieves class-C amplifier operation by biasing a gate or base of each transistor in the second transistor pair with a second bias voltage which is different from the first bias voltage.

In the voltage-controlled oscillator according to the present invention, amplifier circuits each having a cross-coupled transistor pair are provided in parallel (dual configuration), and are respectively biased with different DC bias voltages, achieving class-C amplifier operation with different conduction angles. In this configuration, the amplifier circuit having the smaller conduction angle acts to reduce the phase noise, while the amplifier circuit having the larger conduction angle acts to ensure stable oscillation startup. As a result, the voltage-controlled oscillator according to the present invention achieves low phase noise while ensuring stable oscillation startup and stable oscillation maintenance even under low supply voltage conditions.

BRIEF DESCRIPTION OF THE DRAWINGS

Further features and advantages of the present invention will be apparent from the following description with reference to the accompanying drawings, in which.

DESCRIPTION OF THE PREFERRED EMBODIMENTS

Figure 1:
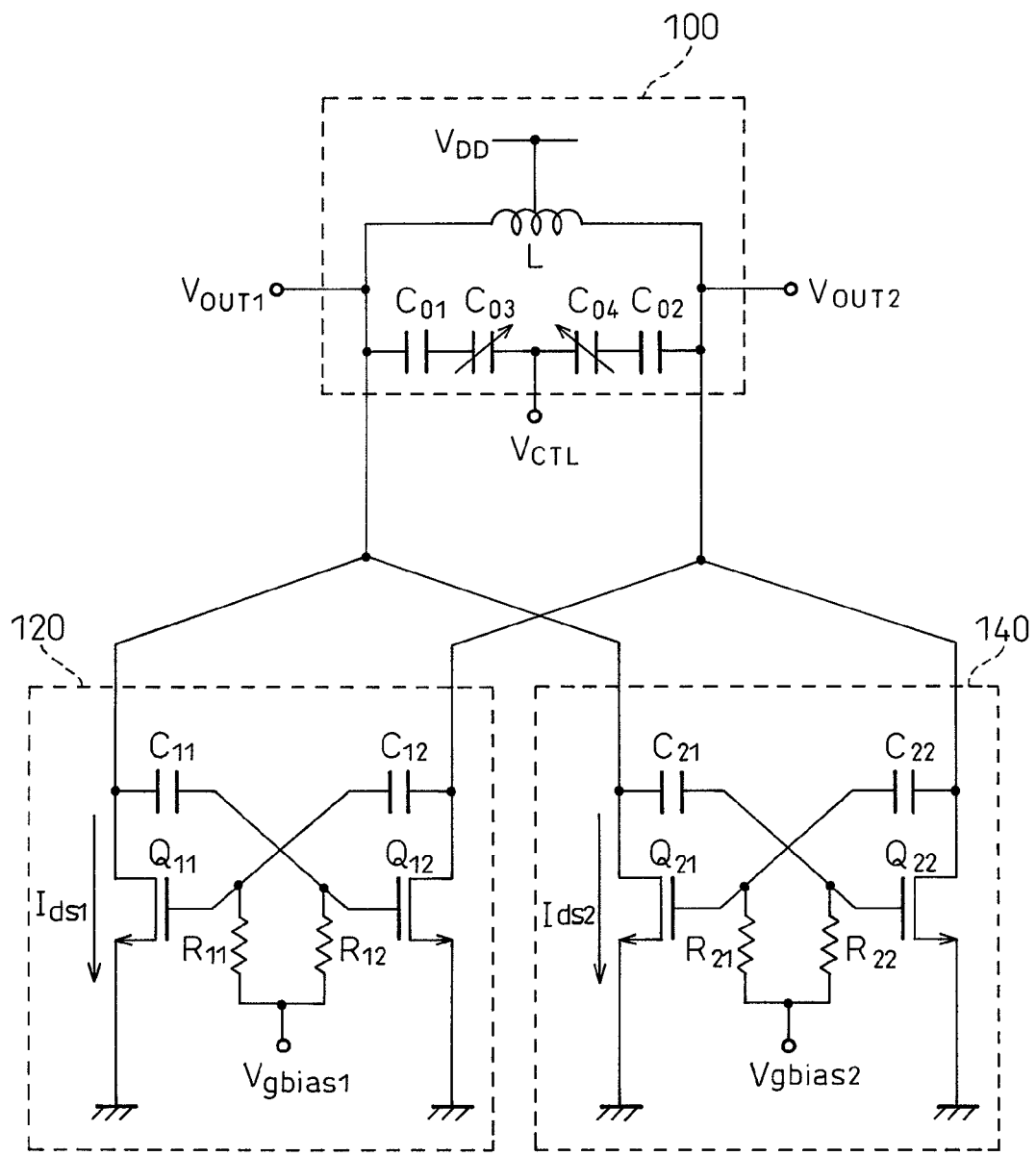
FIG. 1 is a circuit diagram showing one embodiment of a voltage-controlled oscillator (VCO) according to the present invention.

The embodiments of the present invention will be described below with reference to the accompanying drawings. FIG. 1 is a circuit diagram showing one embodiment of a voltage-controlled oscillator (VCO) according to the present invention. As shown in FIG. 1, the VCO includes an LC parallel resonant circuit (LC tank circuit) 100, a first amplifier circuit 120, and a second amplifier circuit 140.

The LC parallel resonant circuit 100 is essentially a loop, which as shown in FIG. 1, includes an inductor L, two fixed capacitors $C_{01}$ and $C_{02}$, and two variable capacitors $C_{03}$ and $C_{04}$. An intermediate tap on the inductor L is connected to a supply voltage $V_{DD}$. The capacitances of the variable capacitors $C_{03}$ and $C_{04}$ vary with a control input voltage $V_{CTL}$ which is applied to their input terminals via a node connecting between them. The two ends of the inductor L are connected to output terminals which provide the two output signal voltages $V_{OUT1}$ and $V_{OUT2}$ of the VCO.

The first and second amplifier circuits 120 and 140 act as a negative resistance circuit that supplies energy to the LC parallel resonant circuit 100 in such a manner as to cancel out the resistance of the resonant circuit 100 by introducing negative resistance into the resonant circuit 100. That is, N-channel MOS (Metal-Oxide Semiconductor) FET (Field-Effect) transistors contained in the respective amplifier circuits act to increase the current that flows through the LC parallel resonant circuit 100.

More specifically, the first amplifier circuit 120 is provided in parallel with the LC parallel resonant circuit 100, and includes a first transistor pair formed from transistors (NMOSFETs) $Q_{11}$ and $Q_{12}$ cross-coupled via capacitors $C_{11}$ and $C_{12}$. That is, the first output signal voltage $V_{OUT1}$ is connected not only to the drain of the transistor $Q_{11}$ but also to the gate of the transistor $Q_{12}$ via the DC-cut capacitor $C_{11}$. Likewise, the second output signal voltage $V_{OUT2}$ is connected not only to the drain of the transistor $Q_{12}$ but also to the gate of the transistor $Q_{11}$ via the DC-cut capacitor $C_{12}$. The sources of the transistors $Q_{11}$ and $Q_{12}$ are both grounded. On the other hand, the gates of the transistors $Q_{11}$ and $Q_{12}$ are connected to a bias voltage $V_{gbias1}$ via resistors $R_{11}$ and $R_{12}$, respectively.

The second amplifier circuit 140 has essentially the same circuit configuration as the first amplifier circuit 120. The difference is that the gates of the transistors $Q_{21}$ and $Q_{22}$ are connected to a bias voltage $V_{gbias2}$, which is higher than $V_{gbias1}$.

The VCO shown in FIG. 1 oscillates while maintaining the oscillations in the LC parallel resonant circuit 100, by the action of the negative resistance circuit formed by the amplifier circuits 120 and 140. When the total inductance value in the LC parallel resonant circuit 100 is denoted by L, and the total capacitance value by C, the oscillation frequency f of the resonant circuit 100 is expressed by the following equation.

$$f = 1/2\pi\sqrt{(LC)}$$

The two output signal voltages $V_{OUT1}$ and $V_{OUT2}$ of the VCO are 180° out of phase with each other as shown by the following equations, where $A_t$ is the amplitude of each output voltage and ϕ is the phase of either one of the output voltages. Here, $V_{DS}$ represents the drain-source voltage of the transistor $Q_{11}$.

$$V_{OUT1} = V_{DD} - A_t \cos\phi = V_{DS}$$

$$V_{OUT2} = V_{DD} + A_t \cos\phi$$

$$A_t < V_{DD}$$

Figure 2:
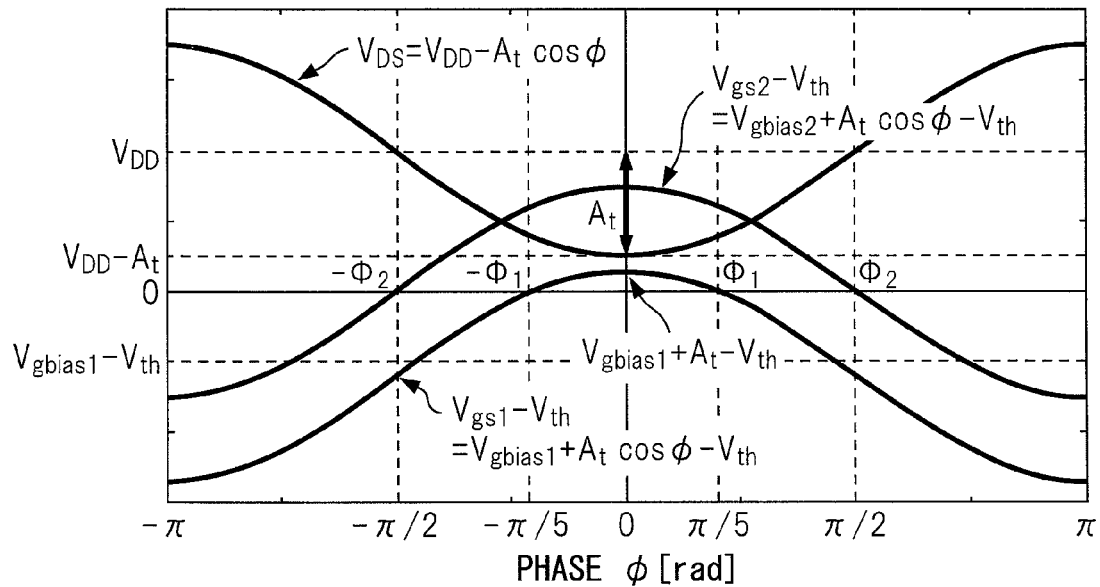
FIG. 2 is a waveform diagram showing the variations of one output signal voltage (drain voltage) and one and other gate voltages in the VCO shown in FIG. 1.

FIG. 2 shows the voltage waveform of one output signal voltage $V_{OUT1}$, i.e., $V_{DS}$, along with voltage waveforms for a voltage $V_{gs1}$-$V_{th}$ obtained by subtracting the threshold voltage $V_{th}$ from the gate-source voltage $V_{gs1}$ of the transistor $Q_{11}$ and a voltage $V_{gs2}$-$V_{th}$ obtained by subtracting the threshold voltage $V_{th}$ from the gate-source voltage $V_{gs2}$ of the transistor $Q_{21}$. The abscissa represents the phase ϕ (−π(rad) to +π(rad)).

In the amplifier circuits 120 and 140, the gate bias voltage $V_{gbiasn}$ (n is 1 or 2) is adjusted relative to the transistor threshold voltage $V_{th}$ such that $$V_{gbiasn} + A_t - V_{th} > 0$$

Further, the gate bias voltage $V_{gbiasn}$ is set so that the following relationship holds.

$$V_{gbias1} < V_{gbias2}$$

The transistor $Q_{11}$ conducts in the phase range represented by −Φ$_1$[rad]<ϕ<+Φ$_1$[rad] where $V_{gs1}$-$V_{th}$>0. In the illustrated example, Φ$_1$=π/5. On the other hand, the transistor $Q_{21}$ conducts in the phase range represented by −Φ$_2$[rad]<ϕ<+Φ$_2$[rad] where $V_{gs2}V_{th}$>0. In the illustrated example, Φ$_2$=π/2>Φ$_1$.

Figure 3:
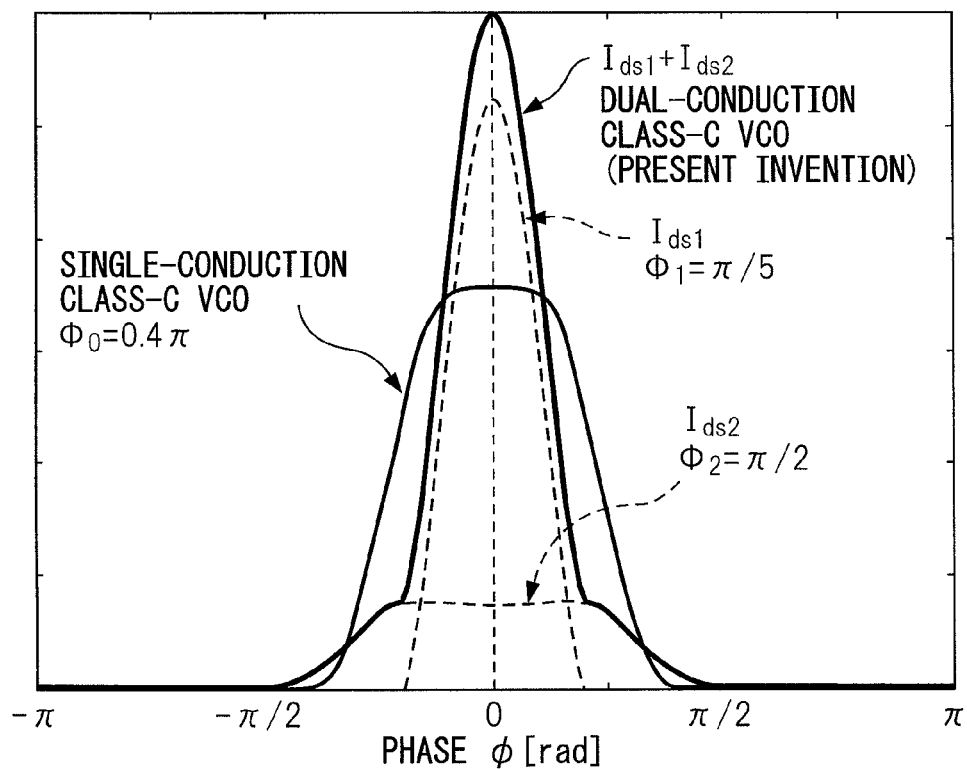
FIG. 3 is a waveform diagram showing the variation of the current flowing in the VCO of FIG. 1 for comparison with a conventional class-C VCO.

As a result, drain-source currents $I_{ds1}$ and $I_{ds2}$ with current waveforms shown in FIG. 3 flow through the respective transistors $Q_{11}$ and $Q_{21}$. The waveform of the total current $I_{ds1}$+$I_{ds2}$ and the current waveform of a conventional single-conduction class-C VCO (Φ$_0$=0.4 π) are also shown in FIG. 3. According to the dual-conduction class-C VCO of the present invention, the equivalent conduction angle can be reduced as shown by the waveform of the current $I_{ds1}$+$I_{ds2}$.

Then, the current $I_{ds1}$ having the smaller conduction angle 2Φ$_1$ contributes to achieving low phase noise, since the current flows in a concentrated manner in a region centered about the phase ϕ=0 where the ISF (Impulse Sensitivity Function) is the smallest. On the other hand, the current $I_{ds2}$ having the larger conduction angle 2Φ$_2$ serves as an oscillation startup current to ensure stable oscillation startup and stable oscillation maintenance.

For transistors $Q_{21}$ and $Q_{22}$, where the current $I_{ds2}$ having the larger conduction angle flows, it is preferable to reduce their transistor sizes. Further, the conduction angle 2Φ$_1$ can be reduced by reducing $V_{gbias1}$ as much as possible under conditions determined by the amplitude.

With the above operation, the VCO shown in FIG. 1 can achieve higher performance than the conventional circuit scheme in terms of FoM (Figure of Merit: Phase noise characteristic normalized by power consumption and oscillation frequency). Table 1 below shows a comparison between the circuit scheme of the present invention and the conventional circuit scheme. In the conventional circuit scheme, the lowest possible operating voltage was about 0.35 [V], but in the circuit scheme of the present invention, the circuit can operate at 0.2 [V], thus achieving low power consumption, as well as low phase noise.

TABLE 1

Performance comparison between present invention and prior art

| | Prior art 1 | Prior art 1-2 | Prior art 1-3 | Present invention | |
|---|---|---|---|---|---|
| Technology | 0.13 μm CMOS | 0.18 μm CMOS | 0.18 μm CMOS | 0.18 μm CMOS | |
| Supply voltage | 1.0 V | 0.5 V | 0.35 V | 0.3 V | 0.2 V |
| Power consumption | 1.3 mW | 0.57 mW | 1.46 mW | 0.159 mW | 0.114 mW |
| Oscillation frequency | 4.9 GHz | 3.8 GHz | 1.4 GHz | 4.5 GHz | 4.5 GHz |
| Phase noise | −130 dBc/Hz @3 MHz-offset | −119 dBc/Hz @1 MHz-offset | −129 dBc/Hz @1 MHz-offset | −109 dBc/Hz @1 MHz-offset | −104 dBc/Hz @1 MHz-offset |
| FoM | 196 dBc/Hz | 193 dBc/Hz | 190 dBc/Hz | 190 dBc/Hz | 187 dBc/Hz |
| Chip area | 0.50 mm² | 0.23 mm² | 0.76 mm² | 0.29 mm² | |
| Topology | Class-C (single) | TF | TF | Class-C (dual) | |

Figure 4A:
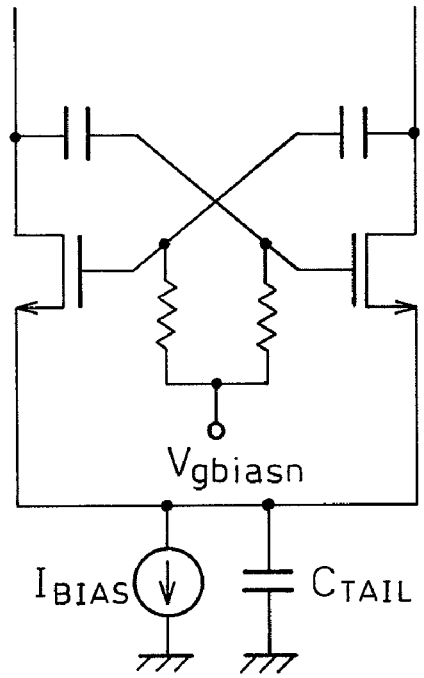
FIGS. 4A and 4B are diagrams showing modified examples of amplifier circuits in the voltage-controlled oscillator (VCO) of FIG. 1.
Figure 4B:
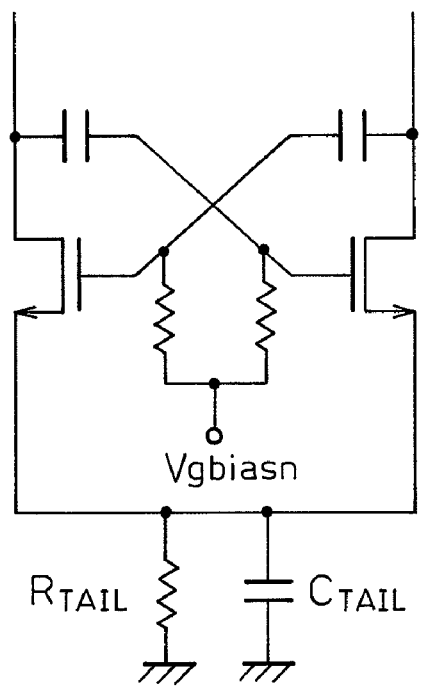

FIGS. 4A and 4B are diagrams showing modified examples of the amplifier circuits 120 and 140 in the voltage-controlled oscillator (VCO) of FIG. 1. In the amplifier circuits shown in FIG. 1, the source of each transistor is directly grounded. However, as shown in FIG. 4A, the sources of the two transistors may be connected together and their connection point may be grounded via a parallel circuit comprising a current source that flows a constant bias current $I_{BIAS}$ and a capacitor $C_{TAL}$ for flowing an alternating current. This configuration serves to reduce the current. Alternatively, as shown in FIG. 4B, the current source $I_{BIAS}$ may be replaced by a resistor $R_{TAIL}$ that forms a pseudo current source.

Figure 5:
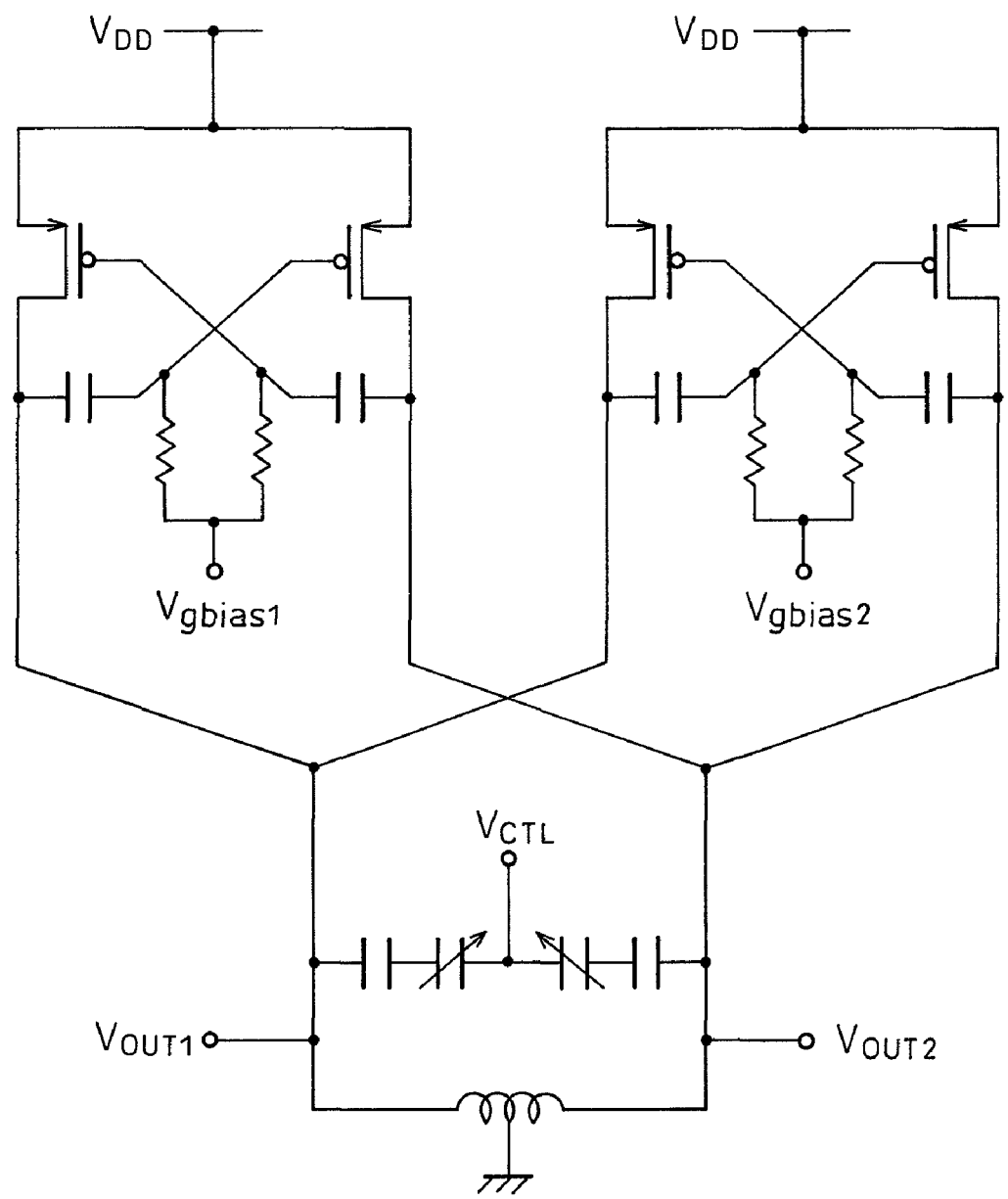
FIG. 5 is a circuit diagram showing another embodiment of a voltage-controlled oscillator (VCO) according to the present invention.
Figure 6A:
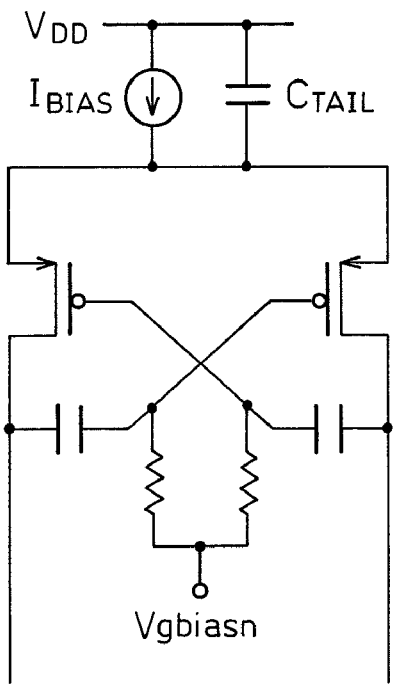
FIGS. 6A and 6B are diagrams showing modified examples of amplifier circuits in the voltage-controlled oscillator (VCO) of FIG. 5.
Figure 6B:
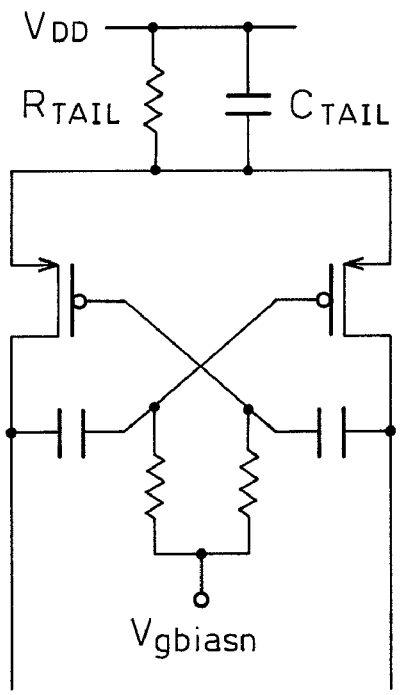

FIG. 5 is a circuit diagram showing another embodiment of a voltage-controlled oscillator (VCO) according to the present invention, and FIGS. 6A and 6B are diagrams showing modified examples of the amplifier circuits in the voltage-controlled oscillator (VCO) of FIG. 5. In the VCO shown in FIG. 1, an N-channel MOSFET is used for each transistor. However, as shown in FIG. 5, each amplifier circuit may be constructed using P-channel MOSFETs instead of N-channel MOSFETs. In that case, the sources of the two P-channel MOSFETs may be connected together and their connection point may be connected to the supply voltage $V_{DD}$ via a parallel circuit comprising a bias current source $I_{BIAS}$ or resistor $R_{TAIL}$ and a capacitor $C_{TRL}$, as shown in FIGS. 6A and 6B.

Further, in each of the circuits shown in FIGS. 1, 4A, and 4B and FIGS. 5, 6A, and 6B, N-channel junction field-effect transistors (JFETs) or P-channel JFETs may be used instead of the N-channel MOSFETs or the P-channel MOSFETs, respectively.

It is also possible to use NPN bipolar transistors or PNP bipolar transistors instead of the N-channel MOSFETs or the P-channel MOSFETs, respectively. When bipolar transistors are used instead of the field-effect transistors (unipolar transistors), the sources are replaced by the emitters, the gates by the bases, and the drains by the collectors.

While the above embodiments have each been described as being provided with two amplifiers each having a cross-coupled transistor pair, it is also possible to connect a third amplifier circuit in parallel with the LC parallel resonant circuit and to achieve class-C amplifier operation with a third conduction angle by applying a third bias voltage to its gate or base. Such a VCO configuration can achieve a further precise oscillation-startup and low-noise design. In other words, the number of amplifier circuits each having a cross-coupled transistor pair can be suitably chosen according to the design.

The voltage-controlled oscillator according to the present invention can be used in application that require ultra-low power consumption, such as wireless sensor networks, battery-driven mobile devices, and biometrics.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A voltage-controlled oscillator which includes an LC parallel resonant circuit whose impedance varies with a control input voltage and a negative resistance circuit for introducing negative resistance into said LC parallel resonant circuit, said negative resistance circuit comprising at least:
    a first amplifier circuit, provided in parallel with said LC parallel resonant circuit and having a first pair of transistors cross-coupled via a first pair of capacitors, that achieves class-C amplifier operation by biasing a gate or base of each transistor in said first transistor pair with a first bias voltage; and
    a second amplifier circuit, provided in parallel with said LC parallel resonant circuit and having a second pair of transistors cross-coupled via a second pair of capacitors, that achieves class-C amplifier operation by biasing a gate or base of each transistor in said second transistor pair with a second bias voltage which is different from said first bias voltage.

2. A voltage-controlled oscillator as claimed in claim 1, wherein said each transistor in said first transistor pair and said each transistor in said second transistor pair are N-channel MOS field-effect transistors.

3. A voltage-controlled oscillator as claimed in claim 1, wherein said each transistor in said first transistor pair and said each transistor in said second transistor pair are P-channel MOS field-effect transistors.

4. A voltage-controlled oscillator as claimed in claim 1, wherein said each transistor in said first transistor pair and/or said each transistor in said second transistor pair are junction field-effect transistors.

5. A voltage-controlled oscillator as claimed in claim 1, wherein said each transistor in said first transistor pair and/or said each transistor in said second transistor pair are bipolar transistors.

6. A voltage-controlled oscillator as claimed in claim 1, wherein a current source is provided on a source or emitter side of said each transistor in said first transistor pair and/or on a source or emitter side said each transistor in said second transistor pair.

7. A voltage-controlled oscillator as claimed in claim 1, wherein a pseudo current source implemented by a resistor is provided on a source or emitter side of said each transistor in said first transistor pair and/or on a source or emitter side said each transistor in said second transistor pair.

* * * * *